(12) United States Patent
Miyagi

(10) Patent No.: US 6,900,478 B2
(45) Date of Patent: May 31, 2005

(54) MULTI-THRESHOLD MIS INTEGRATED CIRCUIT DEVICE AND CIRCUIT DESIGN METHOD THEREOF

(75) Inventor: Satoru Miyagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 299 days.

(21) Appl. No.: 10/268,942

(22) Filed: Oct. 11, 2002

(65) Prior Publication Data

US 2003/0094661 A1 May 22, 2003

(30) Foreign Application Priority Data

Nov. 22, 2001 (JP) ........................................ 2001-356864

(51) Int. Cl.[7] ............................................. H01L 27/10
(52) U.S. Cl. ....................... 257/202; 257/203; 257/207; 257/208
(58) Field of Search ................................ 257/202, 203, 257/207, 208

(56) References Cited

U.S. PATENT DOCUMENTS

| | | | |
|---|---|---|---|
| 5,274,601 A | | 12/1993 | Kawahara et al. |
| 5,796,239 A | * | 8/1998 | van Phuoc et al. .......... 320/107 |
| 6,016,277 A | * | 1/2000 | Ansel et al. ............ 365/189.09 |
| 6,066,866 A | * | 5/2000 | Omori .......................... 257/202 |
| 6,239,614 B1 | * | 5/2001 | Morikawa ..................... 326/39 |
| 6,337,580 B2 | | 1/2002 | Muramatsu |
| 6,460,168 B1 | * | 10/2002 | Yamamoto et al. ............. 716/8 |

FOREIGN PATENT DOCUMENTS

| | | |
|---|---|---|
| JP | 5-210976 | 8/1993 |
| JP | 5-26065 A | 10/1993 |
| JP | 06-350435 A | 12/1994 |
| JP | 07-212217 A | 8/1995 |
| JP | 10-201093 A | 7/1998 |
| JP | 11-306754 | 11/1999 |

OTHER PUBLICATIONS

Patent Abstracts of Japan, vol. 2000, No. 14, Mar. 5, 2001 & JP 2000 323688 A, Nov. 24, 2000.
"A 1–V Multithreshold–Voltage CMOS Digital Signal Processor for Mobile Phone Application", Mutoh et al, *IEEE Journal of Sold–State Circuits*, vol. 31, No. 11, Nov. 1, 1996.
Patent Abstracts of Japan, vol. 1998, No. 10, Aug. 31, 1998 & JP 10 125878 A, May 15, 1998.
Patent Abstracts of Japan, vol. 1999, No. 10, Aug. 31, 1999 & JP 11 145397 A, May 28, 1999.

* cited by examiner

*Primary Examiner*—Jerome Jackson
*Assistant Examiner*—Jesse A. Fenty
(74) *Attorney, Agent, or Firm*—ArentFox

(57) ABSTRACT

On a chip 50A, disposed are macro cell 20A not including a virtual power supply line and a leak-current-shielding MOS transistor of a high threshold voltage, and a leak-current-shielding MOS transistor cell 51 of the high threshold voltage. The transistor cell 51 has a gate line 51G which is coincident with the longitudinal direction of the cell, is disposed along a side of a rectangular cell frame of the macro cell 20A, and has a drain region 51D connected to VDD pads 60 and 61 for external connection, the gate line 51G connected to an I/O cell 73 and a source region 51S connected to a VDD terminal of the macro cell 20A. This VDD terminal functions as a terminal of a virtual power supply line V_VDD.

9 Claims, 10 Drawing Sheets

MULTI-THRESHOLD MIS INTEGRATED CIRCUIT DEVICE AND CIRCUIT DESIGN METHOD THEREOF

BACKGROUND OF THE INVENTION

1. Field of the Invention

The present invention relates to a MIS integrated circuit device of multi-threshold voltage and a circuit design method thereof, and particularly to a MIS (Metal Insulator Semiconductor), more particularly to a CMOS (Complementary Metal Oxide Semiconductor) integrated circuit device of multi-threshold voltage, which is provided with a circuit including a MIS transistor of a low threshold voltage and a MIS transistor of a high threshold voltage for shielding a leak current flowing through the circuit in standby time, and a circuit design method thereof.

2. Description of the Related Art

Recently, there has been a demand for higher speed potable electronic devices and their lower power consumption for long battery life. In CMOS LSIs, because power consumption is proportional to the square of voltage, reducing the power consumption can be achieved by lowering the power source voltage. However, lowering the power source voltage leads to lowering the operating speed of MOS transistors. Thus, improvement of the operating speed has been made by reducing the threshold voltage of MOS transistors.

However, lowering the threshold voltage causes increase in leakage current of MOS transistor in standby time, consequently making it difficult to achieve the lower power consumption. In order to overcome these problems, there has been used a MTCMOS (Multi-threshold Voltage CMOS) as shown in FIGS. 7(A) and 7(B).

In FIG. 7(A), a logic circuit 10 including MOS transistors of a low threshold voltage is connected between a supply line of a virtual power source voltage V_VDD and a supply line of a ground voltage VSS, and a PMOS transistor T1 of a high threshold voltage for shielding the leak current is connected between the supply line of the virtual power source voltage V_VDD and a supply line of a power source voltage VDD. In active time, the power control signal *PCNT is made low, turning on the PMOS transistor T1, and thereby the voltage of the V_VDD supply line becomes VDD, for example 1.8V. On the other hand, in standby time, a power control signal *PCNT is made high, turning off the PMOS transistor T1, and thereby the leak current of the logic circuit 10 is shielded.

Referring to FIG. 7(B), a PMOS transistor T2 of the high threshold voltage for shielding the leak current is connected between a supply line of the virtual power source voltage V_VDD and a supply line of the power source voltage VDD, and a NMOS transistor T3 of the high threshold voltage for shielding the leak current is connected between a supply line of the virtual ground voltage V_VSS and a supply line of the ground voltage VSS. In active time, complementary power control signals *PCNT and PCNT are made low and high, respectively, turning on the PMOS transistor T2 and the NMOS transistor T3. On the other hand, in standby time, the power control signals *PCNT and PCNT are made high and low, respectively, turning off the PMOS transistor T2 and the NMOS transistor T3, and thereby the leak current of the logic circuit 10 is shielded.

The following description will be given of only a case having the leak-current-shielding circuit of FIG. 7(A), but the same applies to a case having the leak-current-shielding circuit of FIG. 7(B).

As shown in FIG. 8, a macro 20 includes N cell rows 21 to 2N. For example, as shown in FIG. 9, each cell row comprises a number of standard cells 31, 32, 33, . . . which include PMOS transistors each having the high threshold voltage for shielding the leak current, each gate being supplied with *PCNT, and logic gates including MOS transistors each having the low threshold voltage. Alternatively, as shown in FIG. 10, each cell row comprises a standard cell 30 which only include a PMOS transistor having the high threshold voltage for shielding the leak current, and standard cells such as a NAND gate cell 31A, an inverter cell 32A, . . . which include MOS transistors each having the low threshold voltage. There are disposed a plurality of standard cells 30 for shielding the leak current in one cell row.

In a case where a macro is purchased as IP (Intellectual Property) from other company, if the macro does not include a MOS transistor for shielding the leak current, the MOS transistor must be inserted as shown in FIGS. 9 or 10. Also when the macro includes MOS transistors for shielding the leak current, the MOS transistor for shielding the leak current must be removed from each cell, or cells for shielding the leak current must be removed from each cell row in order to achieve higher integration, at the sacrifice of decrease of power consumption in standby time.

In addition, in the case of the circuit shown in FIG. 9, because the gate width of the leak-current-shielding MOS transistor is determined by considering a margin in current flowing through the logic gate, in order not to hinder the improvement of speed for each logic gate, the margin in the entire circuit becomes excessively large, increasing the macro-occupied area on the substrate. In case of the circuit shown in FIG. 10, because no logic gate is included in the leak-current-shielding cell, useless area becomes increased, thereby increasing the macro-occupied area on the substrate.

SUMMARY OF THE INVENTION

Accordingly, it is an object of the present invention to provide a multi-threshold MIS integrated circuit device and a circuit design method thereof, wherein a macro has no need to include a virtual power supply line and a leak-current-shielding MIS transistor of a high threshold voltage.

In one aspect of the present invention, there is provided a multi-threshold MIS integrated circuit device, comprising on a substrate:

a macro, including an internal circuit and a virtual power supply line connected to the internal circuit, the internal circuit including a MIS transistor having a first threshold voltage; and a leak-current-shielding MIS transistor cell, having a gate line connected to a power control line, having a longitudinal direction coincident with the gate line, being formed along a side of a macro frame of the macro, having a second threshold voltage different from the first threshold voltage, having a current path whose one end and another end are connected to a power supply line and the first virtual power supply line, respectively.

According to this configuration, a power supply line of the macro that does not include a virtual power supply line and a leak-current-shielding MIS transistor can be used as a virtual power supply line. In addition this allows reducing the design time of a multi-threshold MIS integrated circuit device. Further, the size such as length of the leak-current-shielding MIS transistor cell is suitably determined according to the current consumption of the macro, so as to repress increase of the macro-occupied area on the substrate as compared with the prior art.

DESCRIPTION OF THE PREFERRED EMBODIMENTS

Figure 1:
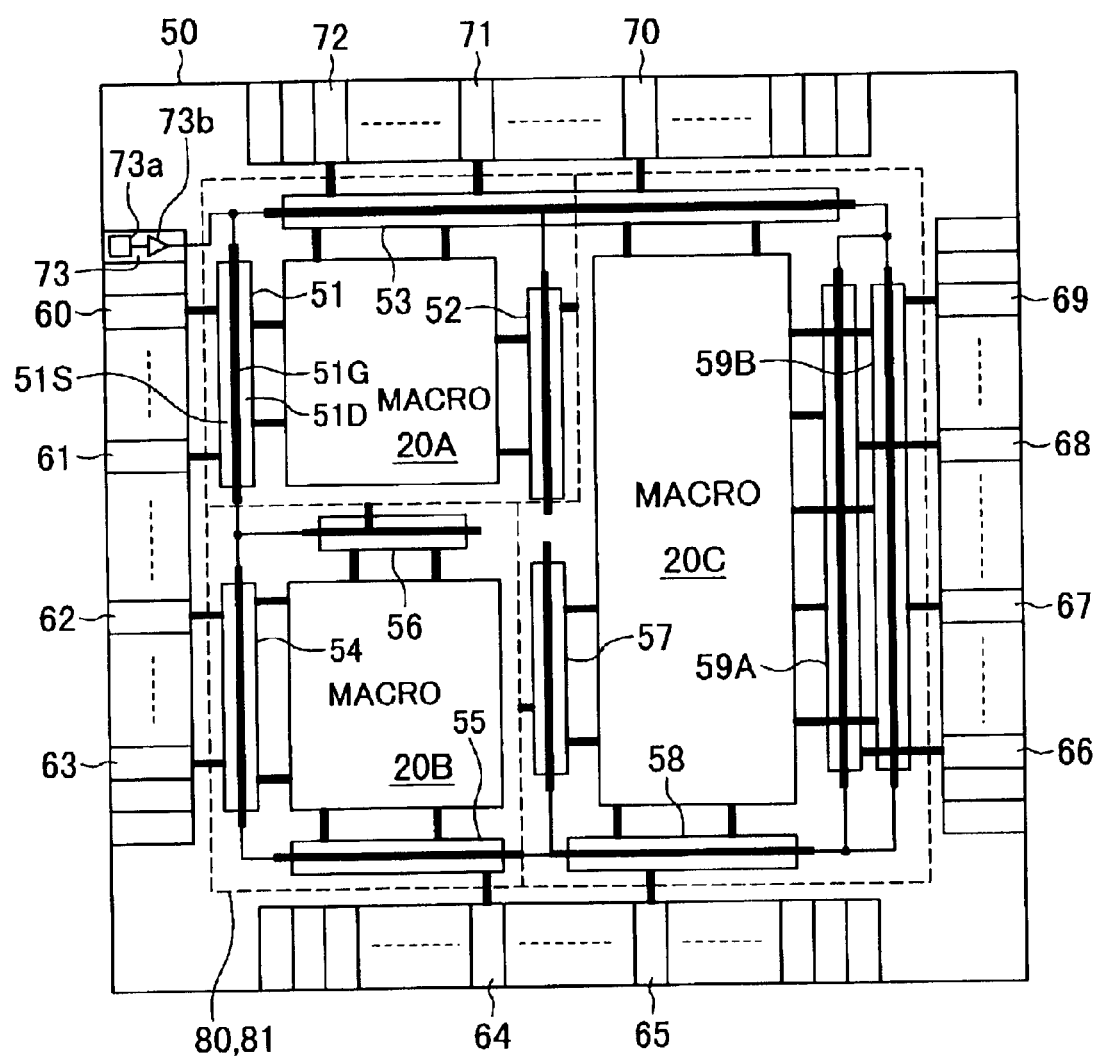
FIG. 1 is a schematic on-chip layout view of a multi-threshold voltage MOS integrated circuit device according to a first embodiment of the present invention.

Hereinafter, preferred embodiments of the present invention will be described in more detail referring to the drawings.

First Embodiment

FIG. 1 is a schematic on-chip layout view of a multi-threshold voltage MOS integrated circuit device according to a first embodiment of the present invention.

Figure 7A:
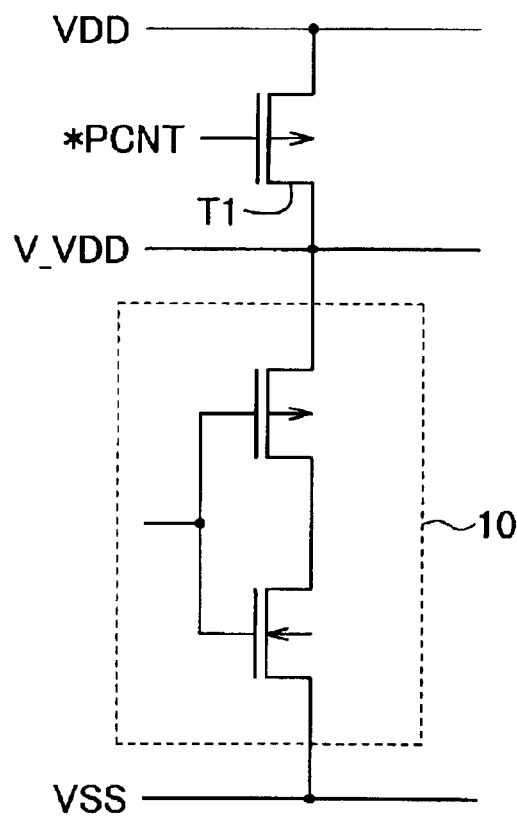
FIGS. 7(A) and 7(B) are views showing prior art multi-threshold voltage CMOS circuits.
Figure 7B:
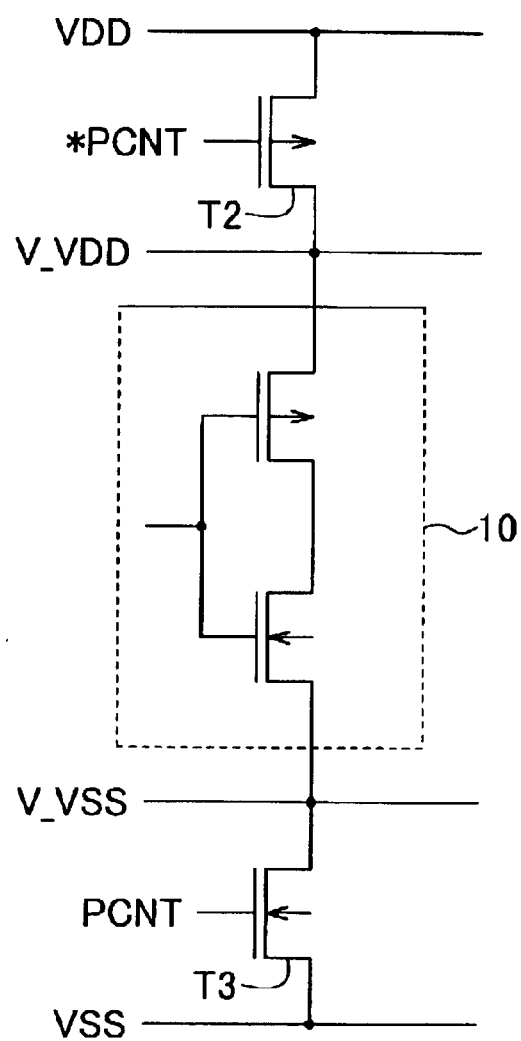
Figure 8:
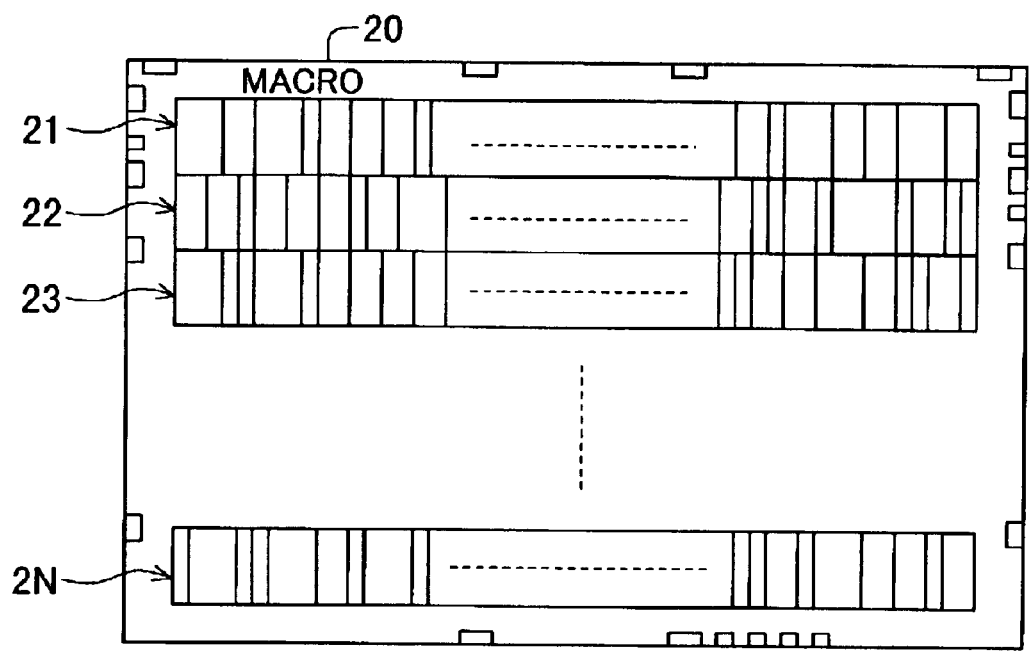
FIG. 8 is a layout view showing a prior art macro consisting of standard cell arrays.

Macros 20A, 20B and 20C are disposed on a semiconductor chip 50, and any of them do not have the leak-current-shielding circuit shown in FIG. 7(A) or 7(B), but are, for example, ones purchased as IP from other companies. Macros 20A, 20B and 20C are, for example, a memory, a DSP (Digital Signal Processor), and a CPU, respectively. According to the present invention, determination on whether or not using supply lines of power source voltages VDD and VSS in the macro 20A to 20C as supply lines of virtual power source voltages V_VDD and V_VSS, respectively, is determined according to whether or not connecting these lines with leak-current-shielding circuits independent from these lines. In the first embodiment, because the VDD supply lines in the macros 20A to 20C are used as V_VDD supply lines, VDD is denoted by V_VDD.

Macro-frames of the macro 20A to 20C are all rectangular in shape, and leak-current-shielding NMOS transistor cells of a high threshold voltage are disposed along sides of each macro-frame.

More specifically, PMOS transistor cells 51 to 53 are disposed in the peripheral portion of the macro-frame of the macro 20A, along three sides of the macro-frame. The cell 51 includes a gate line 51G parallel to a side of the macro-frame of the macro 20A, and a source region 51S and a drain region 51D respectively formed in a bulk at both-sides of the gate line 51G. The longitudinal direction of the cell 51 is coincident with the direction of the gate line 51G. Rectangles described in edge portions of the semiconductor chip 50 indicate I/O cells each of which is a pad for an external power supply voltage, or an I/O pad for external signal and an I/O buffer gate.

Relationship between the PMOS transistor cell 51 and the macro 20A is the same as the relationship between the PMOS transistor T1 and the logic circuit 10 shown in FIG. 7(A). The source region 51S of the PMOS transistor cell 51 is connected to VDD pads 60 and 61 for external connection, the gate line 51G is connected to an I/O cell 73, and the drain region 51D is connected to V_VDD terminals of the macro 20A. The I/O cell 73 comprises a pad 73a, and a buffer gate 73b that has an input connected to the pad 73a and an output connected to the gate line 51G. Not-shown VSS supply lines in the macro 20A are connected to VSS pads formed in the edge portion of the semiconductor chip 50.

The pad 73a receives the power control signal *PCNT from the external. In active time, the power control signal *PCNT is made low to turn on the PMOS transistor cell 51, and the power source voltage VDD applied to the VDD pads 60 and 61 is supplied to V_VDD line in the macro 20A through the PMOS transistor cell 51. In standby time, the power control signal *PCNT is made high to turn off the PMOS transistor cell 51, thereby leak current is hindered from flowing through MOS transistors of a low threshold voltage in off state, included in the macro 20A.

Operations and configurations of the PMOS transistor cells 52 to 54 are similar to those of the PMOS transistor cell 51.

The same as the macro 20A applies to macros 20B and 20C. That is, PMOS transistor cells 54 to 56 are disposed along respective three sides of the macro-frame of the macro 20B, and PMOS transistor cells 57, 58, 59A and 53 are disposed along respective four sides of the macro 20C. The PMOS transistor cell 53 is commonly used for both the macros 20A and 20C. Because the macro 20C has relatively high current consumption, a PMOS transistor cell 59B is disposed parallel to the PMOS transistor cell 59A, and the PMOS transistor cells 59A and 59B are connected in parallel between the macro 20C and the VDD pad 69. Gate lines of the PMOS transistor cells 51 to 59B are commonly connected to each other. VDD pads 62 to 72 are connected to respective source regions of the corresponding PMOS transistor cells.

Figure 2:
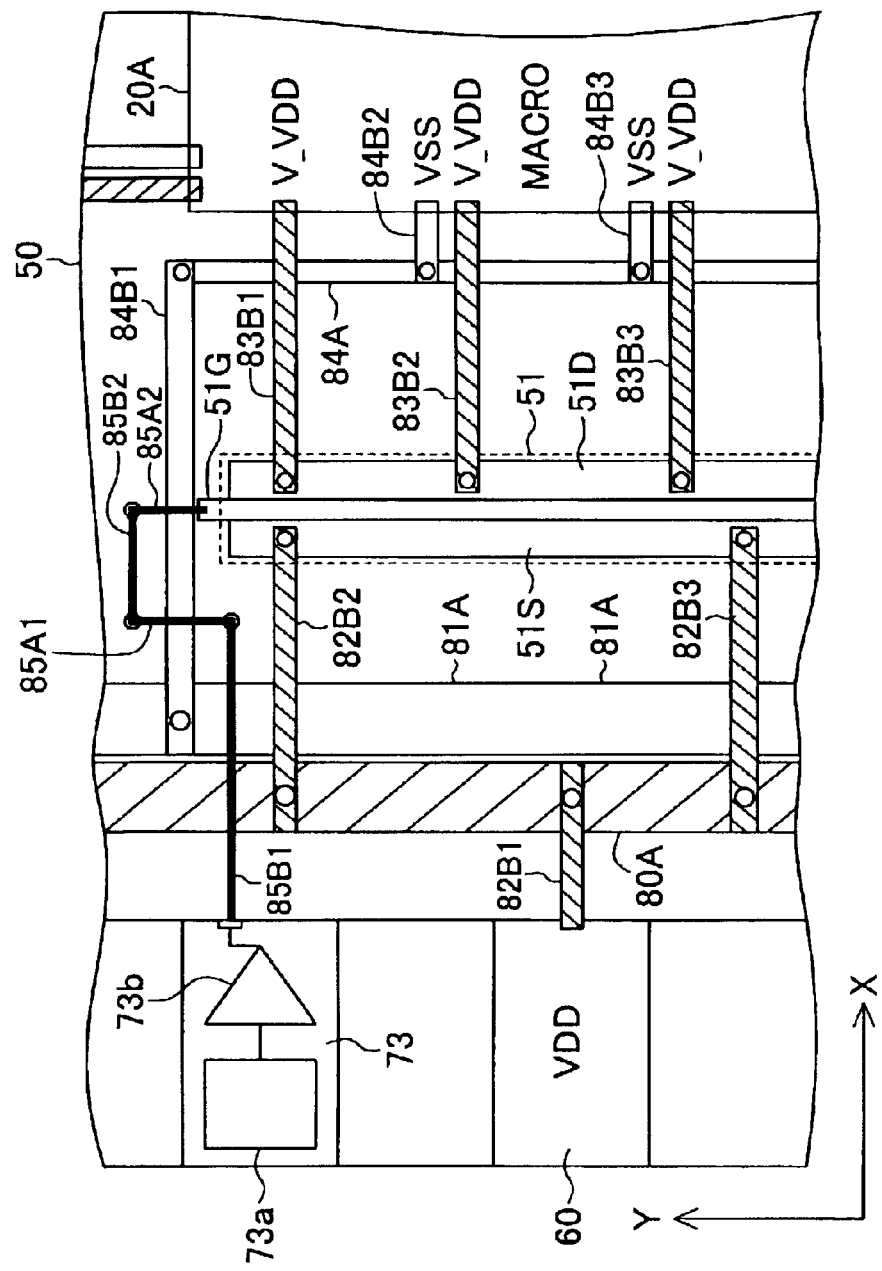
FIG. 2 is a more detailed layout view showing the PMOS transistor cell 51 and the vicinity thereof shown in FIG. 1.

FIG. 2 is a more detailed layout view showing the PMOS transistor cell 51 and the vicinity thereof shown in FIG. 1.

In FIG. 2, metal wires in X and Y directions belong to different wire-layers, and reference symbols A and B indicate metals in a first metal wire-layer and a second metal wire-layer thereabove, respectively. Connections between wires in different wire layers are connected through conductors in respective contact holes indicated by "O" in the figure. In FIG. 2, wires of voltages VDD and V_VDD are hatched. Small rectangles described in edge portions of the macro 20A and I/O cells indicate terminals when seeing the macro 20A and the I/O cells as black boxes, which are used for automatic wiring design between the macros and I/O cells. A VDD supply line 80A and a VSS supply line 81A belong to a VDD supply ring 80 and a VSS supply ring 81, respectively, shown with dashed lines in FIG. 1. In this figure, the each dashed line represents both VDD and VSS rings for simplification.

A VDD supply line 82B1 is connected between the VDD pad 60 and the VDD supply line 80A, and a VDD supply lines 82B2 and 82B3 are connected between the VDD supply line 80A and the source region 51S. In addition, VDD supply lines 83B1, 83B2 and 83B3 are connected between the drain region 51D and respective V_VDD terminals of the macro 20A. The VSS supply line 81A is connected on one hand to a not-shown VSS pad, and on the other hand to a plurality of VSS terminals of the macro 20A through VSS supply lines 84B1 and 84A and then VSS supply lines 84B2 and 84B3. The output of the buffer gate 73b is connected to the gate line 51G through the control signal lines 85B1, 85A1, 85B2 and 85A2. In FIG. 2, these control signal lines are shown with centerlines for simplification.

Figure 3:
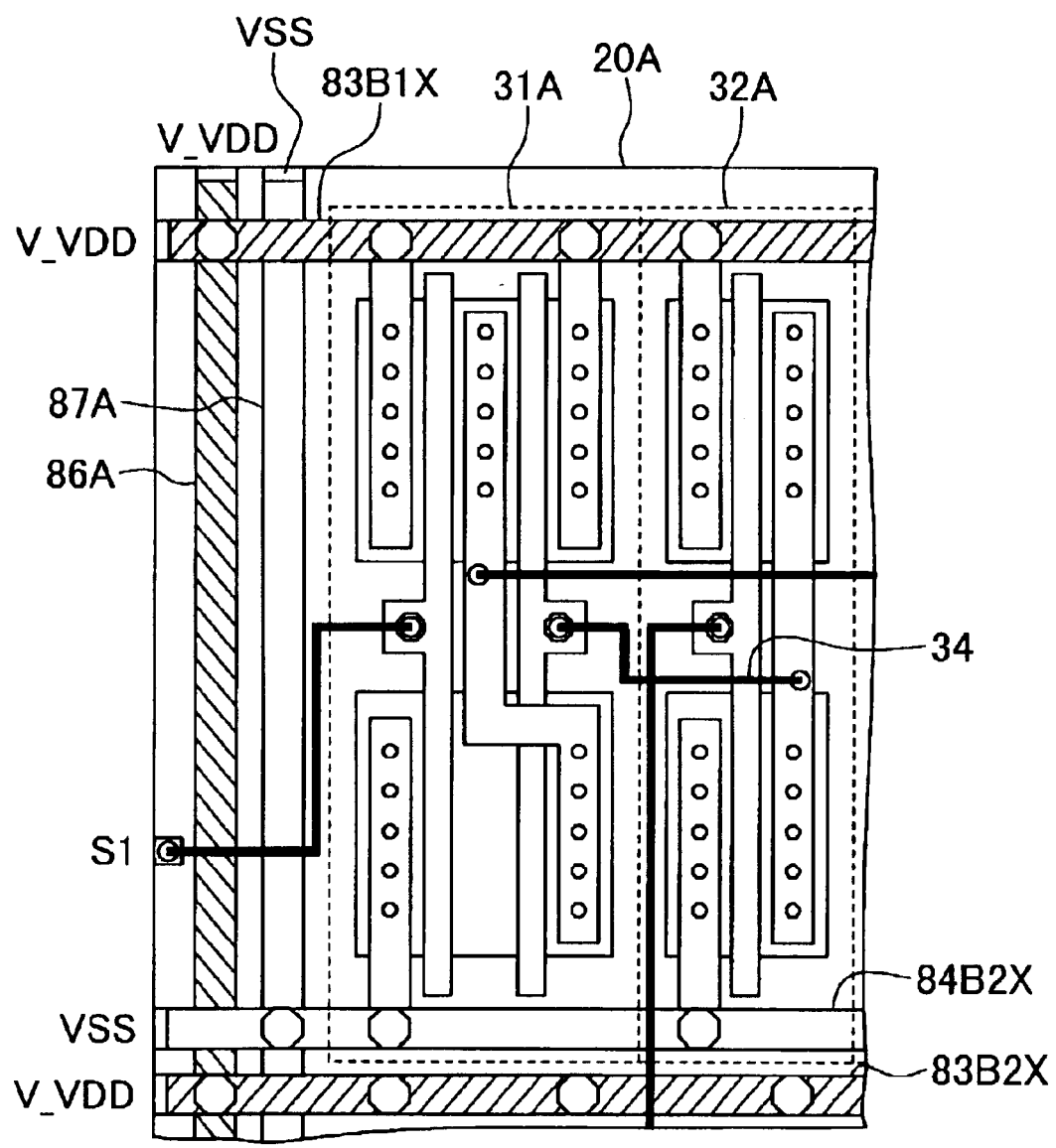
FIG. 3 is a detailed layout view showing the internal of a part of the macro 20A shown in FIG. 1.

FIG. 3 is a detailed layout view partially showing the internal of the macro 20A shown in FIG. 1.

A first cell row of the macro 20A includes a NAND gate cell 31A and an inverter cell 32A as standard cells. The NAND gate cell 31A and the inverter cell 32A have the same circuit configuration as those of FIG. 10, and both are connected to each other through a signal line 34. In FIG. 3, the signal line is shown with centerline for simplification. In order to supply a power source voltage to the first cell row, a VDD supply line 83B1X and a VSS supply line 84B2X are formed along one end side and the other end side, respectively, of the first cell. A V_VDD supply line 83B2X is for a second cell row. The V_VDD supply line 83B1X, the VSS supply line 84B2X, and the V_VDD supply line 83B2X are connected to the V_VDD supply line 83B1, the VSS supply line 84B2, and the V_VDD supply line 83B2, respectively, that are shown in FIG. 2. The V_VDD supply line of each cell is connected to a V_VDD supply line 86A in direction perpendicular thereto, and in the same way, the VSS supply line of each cell is connected to a VSS supply line 87A in direction perpendicular thereto.

Figure 9:
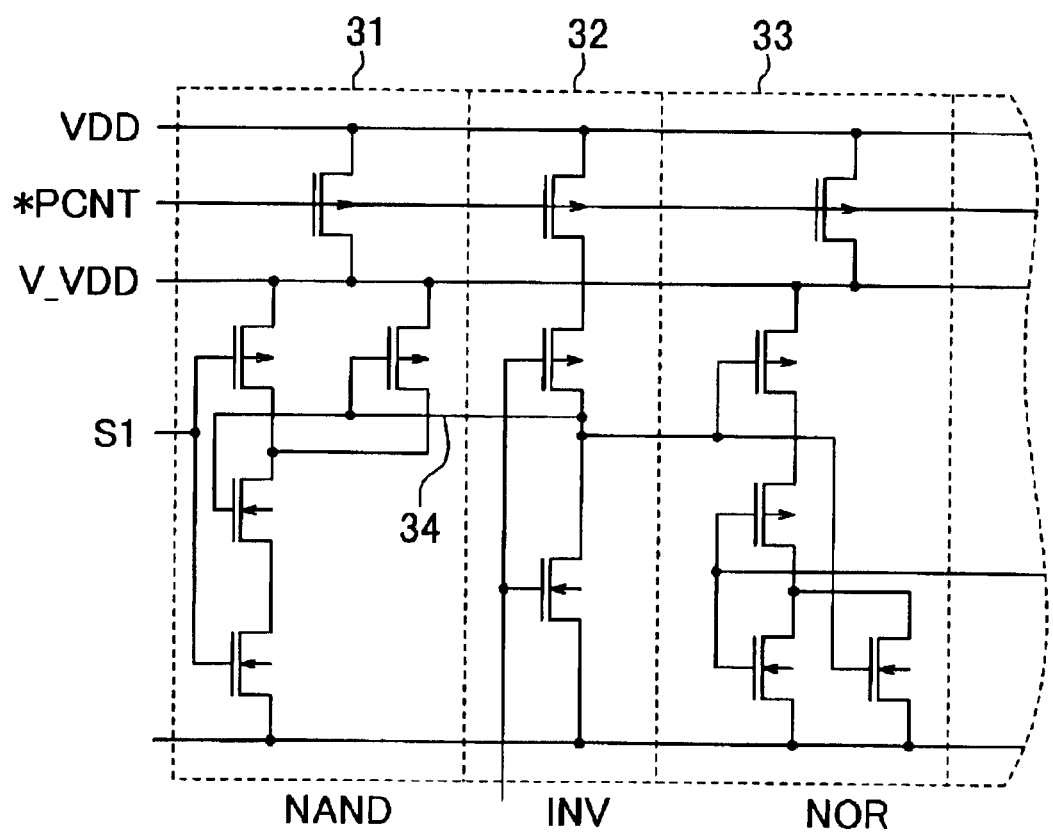
FIG. 9 is a circuit view showing a part of one cell row shown in FIG. 8.
Figure 10:
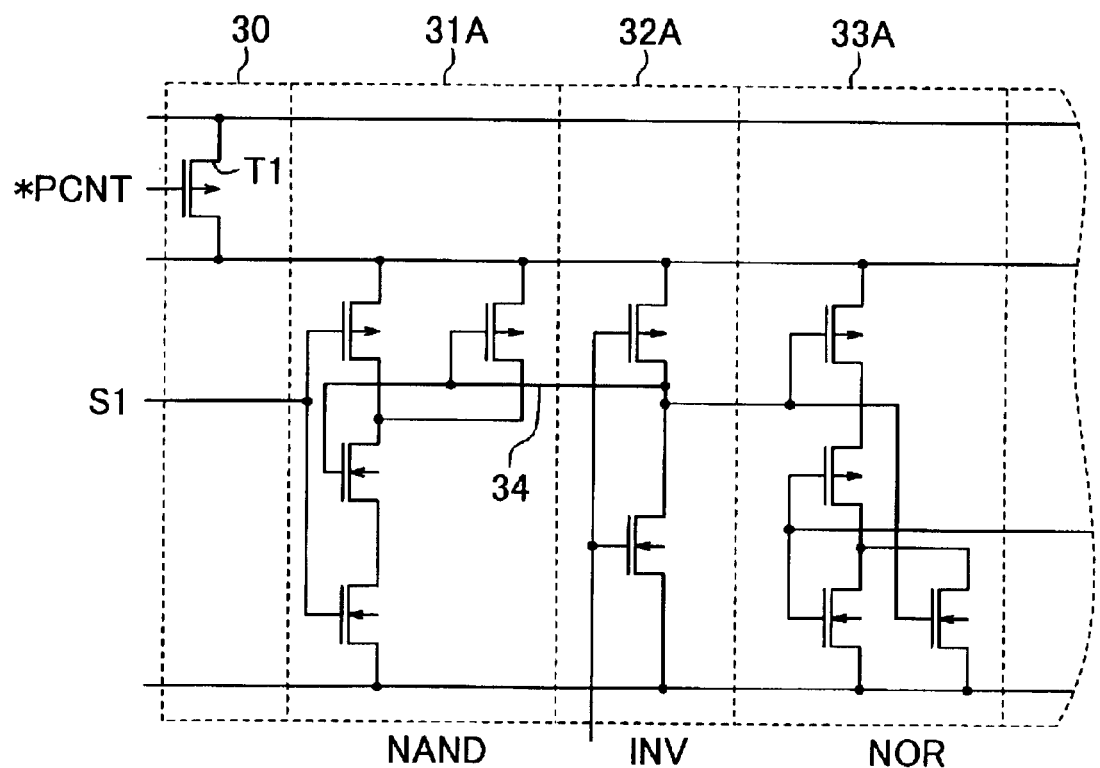
FIG. 10 is a circuit view showing another configuration of a part of one cell row shown in FIG. 8.

According to the multi-threshold voltage MOS integrated circuit device of the first embodiment, since the leak-current-shielding PMOS transistor of a high threshold voltage is disposed along each side of the macro-frame of a macro, there is no need to dispose the leak-current-shielding PMOS transistor T1 of the high threshold voltage in each standard cell inside the prior art macro as shown in FIG. 9, or dispose the plurality of leak-current-shielding standard cells 30 in each cell row as shown in FIG. 10, which allows shortening the design time. In addition, the size such as length of the leak-current-shielding PMOS transistor cell is suitably determined according to the current consumption of the macro, in result of repressing increase of the macro-occupied area on the chip due to forming the PMOS transistor T1 in each cell of each cell row, or due to forming the leak-current-shielding standard cells 30 in each of the plurality of cells.

Second Embodiment

Figure 4:
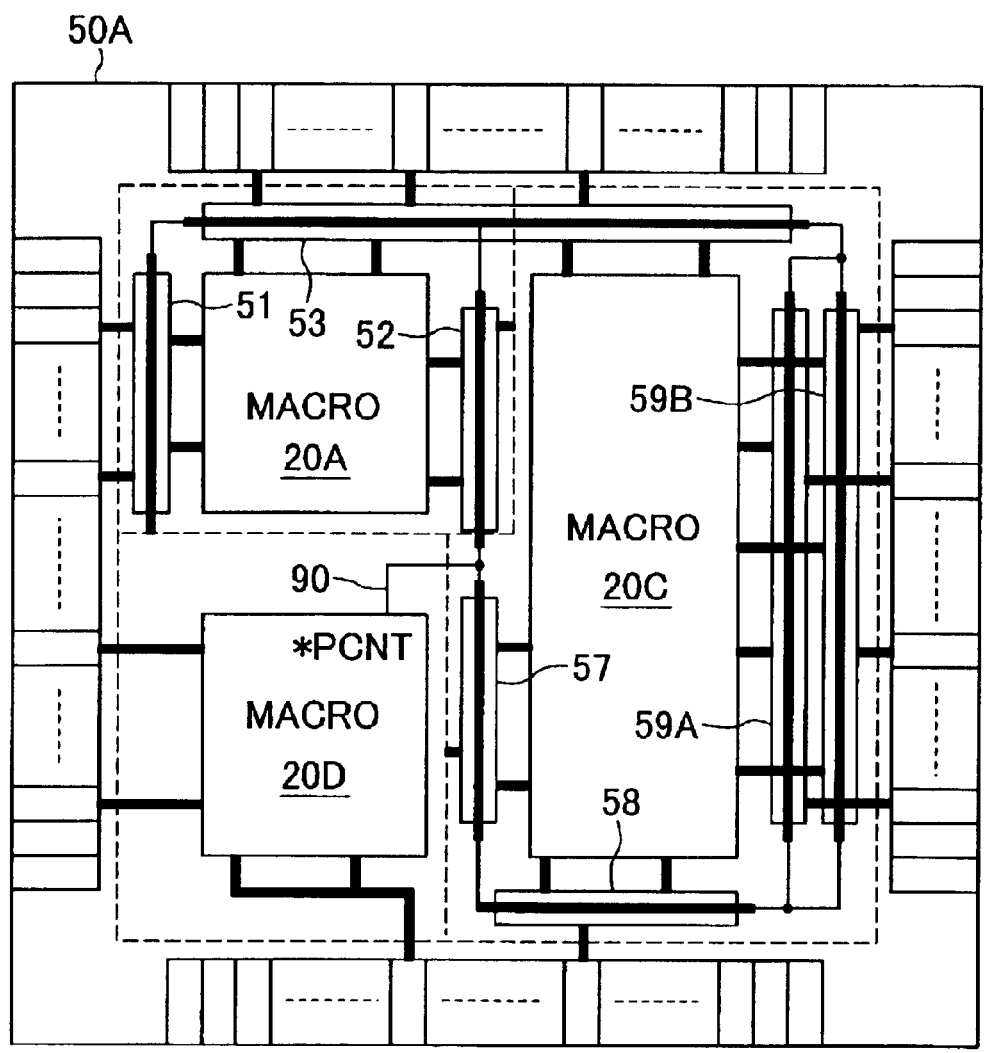
FIG. 4 is a schematic on-chip layout view of a multi-threshold voltage MOS integrated circuit device according to a second embodiment of the present invention.

FIG. 4 is a schematic on-chip layout view of a multi-threshold voltage MOS integrated circuit device, according to a second embodiment of the present invention.

In this semiconductor chip 50A, the power source voltages VDD and VSS are directly supplied to a macro 20D from VDD pads for external connection. The macro 20D is not provided with a power source shielding MOS transistor of a high threshold voltage. The macro 20D outputs a power control signal *PCNT through a terminal that is connected through a control signal line 90 to gate lines of a PMOS transistor cells 51 to 53 and 57 to 59B. Using the power control signal *PCNT, the macro 20D performs on/off controls of the PMOS transistor cells 51 to 53 and 57 to 59B, according to external signal or internal state.

The others are the same as the first embodiment.

Third Embodiment

Figure 5:
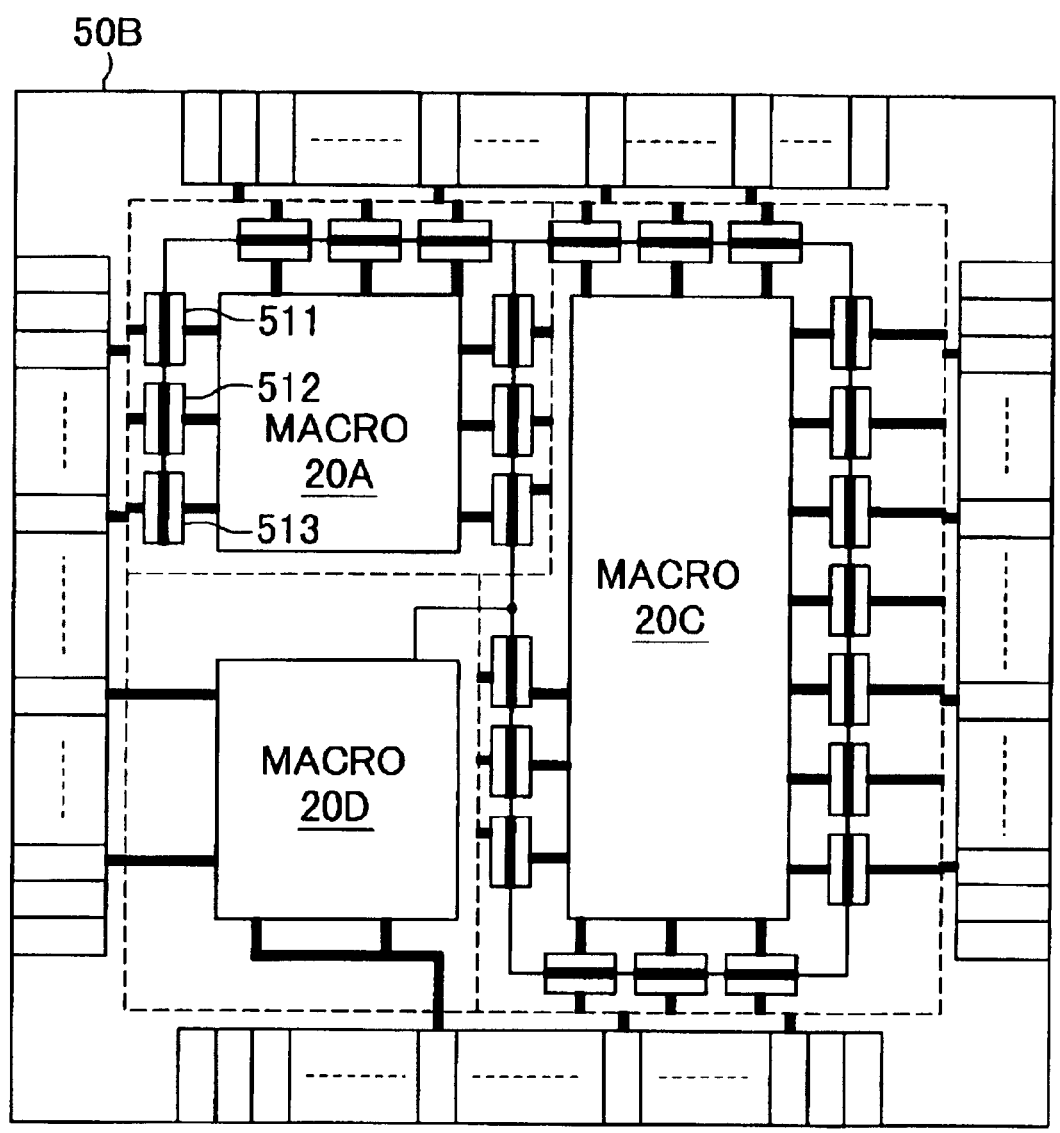
FIG. 5 is a schematic on-chip layout view of a multi-threshold voltage MOS integrated circuit device according to a third embodiment of the present invention.

FIG. 5 is a schematic on-chip layout view of a multi-threshold voltage MOS integrated circuit device according to a third embodiment of the present invention.

In this semiconductor chip 50B, in stead of the leak-current-shielding PMOS transistor cell 51 of FIG. 4, disposed along a side of the macro-frame of the macro 20A, there are arranged PMOS transistor cells 511 to 513 in predetermined length, for example 100 μm, which are registered in a cell library. Gate lines of neighboring PMOS transistors 511 to 513 are connected to each other. The necessary number of PMOS transistor cells 511 to 513 for the macro 20A is determined based on the current consumption of the macro 20A in active time. The same applies to the other PMOS transistor cells. Exception is that those corresponding to the PMOS transistor cell 59B of FIG. 4 are omitted in FIG. 5.

The others are the same as the second embodiment.

The third embodiment allows forming the leak-current-shielding PMOS transistor cells for each macro by using a single transistor cell registered in the cell library.

Note that each leak-current-shielding NMOS transistor cell shown in FIGS. 1 and 4 may be constructed by consecutively disposing transistor cells having such a predetermined length with no gap therebetween.

Fourth Embodiment

Figure 6:
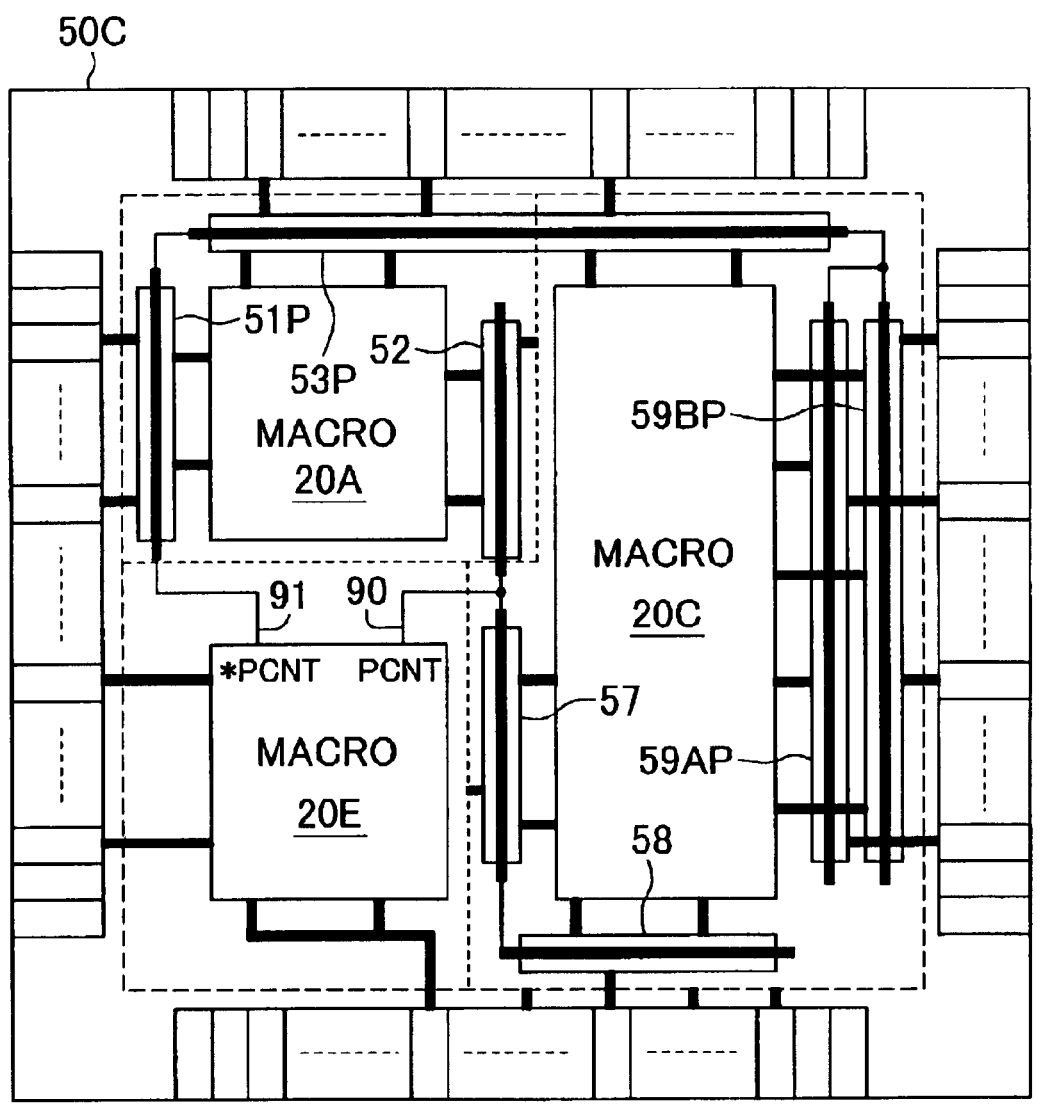
FIG. 6 is a schematic on-chip layout view of a multi-threshold voltage MOS integrated circuit device according to a fourth embodiment of the present invention.

FIG. 6 is a schematic on-chip layout view of a multi-threshold voltage MOS integrated circuit device according to a fourth embodiment of the present invention.

In this semiconductor chip 50C, the VDD and VSS supply lines inside each macro are used as respective V_VDD and V_VSS supply lines. In addition, in order to form the leak-current-shielding circuits in the VDD supply line side and the VSS supply line side as shown in FIG. 7(B), leak-current-shielding PMOS transistor cells 51P, 53P, 59AP and 59BP of a high threshold voltage are connected between the VDD pads for external connection and the V_VDD terminals of macros, and leak-current-shielding NMOS transistor cells 52, 57 and 58 of the high threshold voltage are connected between the VSS pads for external connection and the V_VSS terminals of the macros. Gate lines of the PMOS transistor cells 51P, 53P, 59AP and 59BP and gate lines of the NMOS transistor cells 52, 57 and 58 are connected to terminals of respective power control signals *PCNT and PCNT of a macro 20E through control signal lines 91 and 90, respectively.

The macro 20E allows the NMOS transistor cells 52, 57 and 58, and the PMOS transistor cells 51P, 53P, 59AP and 59BP to be turned on by setting the complementary power control signals PCNT and *PCNT high and low, respectively, while inversely allows them to be turned off by setting low and high.

Although preferred embodiments of the present invention have been described, it is to be understood that the invention is not limited thereto and that various changes and modifications may be made without departing from the spirit and scope of the invention.

For example, the leak-current-shielding transistor cell may employ NMOS instead of PMOS.

Further, although the semiconductor chip 50A shown in FIG. 4 is constituted so that the macro 20D carries out on/off controls of all the leak-current-shielding PMOS transistor cells of the macros 20A and 20C at the same time, the macro 20D may independently carry out on/off controls of the leak-current-shielding PMOS transistor cells of the macro 20A and on/off controls of the leak-current-shielding PMOS transistor cells of the macro 20C.

Furthermore, the low threshold voltage transistor circuit is only required to include a MIS transistor.

What is claimed is:

1. A multi-threshold MIS integrated circuit device comprising:

a first macro, including a first internal circuit and a first virtual power supply line connected to the first internal circuit, the first internal circuit including a MIS transistor having a first threshold voltage; and a first leak-current-shielding MIS transistor cell, having a first gate line connected to a first power control line, having a longitudinal direction coincident with the first gate line, being formed along a side of a macro frame of the first macro, having a second threshold voltage different from the first threshold voltage, having a current path whose one end and another end are connected to a first power supply line and the first virtual power supply line, respectively, wherein the first macro and the first leak-current-shielding MIS transistor cell are formed on a substrate.

2. The multi-threshold MIS integrated circuit device according to claim 1, wherein the first MIS transistor cell has a predetermined size, a plurality of the first MIS transistor cells are disposed along a side of the macro frame of the first macro, and gate lines of each adjacent pair of the first MIS transistor cells are connected to each other.

3. The multi-threshold MIS integrated circuit device according to claim 1, wherein the macro frame of the first macro is rectangular in shape, and the first MIS transistor cells are disposed along at least two sides of the macro frame.

4. The multi-threshold MIS integrated circuit device according to claim 1, wherein the first macro further includes a second virtual power supply line connected to the first internal circuit, the device further comprising:

a second leak-current-shielding MIS transistor cell, having a second gate line connected to a second power control line, having a longitudinal direction coincident with the second gate line, being formed along a side of a macro frame of the first macro, having a third threshold voltage different from the first threshold voltage, having a current path whose one end and another end are connected to a second power supply line and the second virtual power supply line, respectively.

5. The multi-threshold MIS integrated circuit device according to claim 4, wherein the second power supply line is connected to a pad formed on the substrate, the pad being for external connection.

6. The multi-threshold MIS integrated circuit device according to claim 1, wherein the first power supply line is connected to a pad formed on the substrate, the pad being for external connection.

7. The multi-threshold MIS integrated circuit device according to claim 1, wherein the first power supply line has a power supply ring formed in a peripheral of one including the first macro and the first MIS transistor cell.

8. The multi-threshold MIS integrated circuit device according to claim 1, wherein the first power control line is connected to a pad formed on the substrate, the pad being for external connection.

9. The multi-threshold MIS integrated circuit device according to claim 1, further comprising: a second macro, including a second internal circuit for supplying a control signal to the first power control line, including the first power supply line connected to both the second internal circuit and a pad formed on the substrate, the pad being for external connection.

* * * * *